US009773653B2

(12) United States Patent
Takami et al.

(10) Patent No.: US 9,773,653 B2
(45) Date of Patent: Sep. 26, 2017

(54) FERROMAGNETIC MATERIAL SPUTTERING TARGET CONTAINING CHROMIUM OXIDE

(71) Applicant: JX Nippon Mining & Metals Corporation, Tokyo (JP)

(72) Inventors: Hideo Takami, Ibaraki (JP); Atsutoshi Arakawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 278 days.

(21) Appl. No.: 14/364,141

(22) PCT Filed: Jan. 28, 2013

(86) PCT No.: PCT/JP2013/051695
§ 371 (c)(1),
(2) Date: Jun. 10, 2014

(87) PCT Pub. No.: WO2013/125296
PCT Pub. Date: Aug. 29, 2013

(65) Prior Publication Data
US 2014/0360870 A1    Dec. 11, 2014

(30) Foreign Application Priority Data
Feb. 23, 2012 (JP) ................ 2012-037263

(51) Int. Cl.
C23C 14/34    (2006.01)
H01J 37/34    (2006.01)
G11B 5/851    (2006.01)

(52) U.S. Cl.
CPC ...... *H01J 37/3429* (2013.01); *C23C 14/3414* (2013.01); *G11B 5/851* (2013.01)

(58) Field of Classification Search
CPC .. H01J 37/3429; C23C 14/3414; G11B 5/851; C22C 19/07
See application file for complete search history.

(56) References Cited

U.S. PATENT DOCUMENTS

| | | | |
|---|---|---|---|
| 7,494,617 B2 | 2/2009 | Ziani | |
| 7,909,949 B2 | 3/2011 | Nakamura et al. | |
| 7,927,434 B2 | 4/2011 | Nakamura et al. | |
| 2006/0234091 A1 | 10/2006 | Racine et al. | |
| 2009/0139859 A1 | 6/2009 | Takami et al. | |
| 2009/0211902 A1* | 8/2009 | Fujii | C22C 1/0483 204/298.13 |
| 2009/0229976 A1 | 9/2009 | Kato et al. | |
| 2009/0242393 A1 | 10/2009 | Satoh | |
| 2010/0270146 A1 | 10/2010 | Nonaka et al. | |
| 2010/0320084 A1 | 12/2010 | Sato | |
| 2011/0048935 A1 | 3/2011 | Koide | |
| 2011/0162971 A1 | 7/2011 | Nakamura et al. | |
| 2011/0247930 A1* | 10/2011 | Sato | C22C 32/0026 204/298.13 |
| 2011/0284373 A1 | 11/2011 | Sato et al. | |
| 2012/0097535 A1 | 4/2012 | Ogino et al. | |
| 2012/0114975 A1* | 5/2012 | Liu | C23C 14/3414 428/826 |
| 2012/0118734 A1 | 5/2012 | Sato et al. | |
| 2012/0241316 A1 | 9/2012 | Arakawa | |
| 2012/0241317 A1 | 9/2012 | Ikeda et al. | |
| 2012/0273347 A1 | 11/2012 | Koide | |
| 2013/0001079 A1 | 1/2013 | Sato | |
| 2013/0015061 A1 | 1/2013 | Sato | |
| 2013/0098760 A1 | 4/2013 | Takami et al. | |
| 2013/0112555 A1 | 5/2013 | Ogino et al. | |
| 2013/0134038 A1 | 5/2013 | Sato et al. | |
| 2013/0175166 A1 | 7/2013 | Miyashita et al. | |
| 2013/0175167 A1 | 7/2013 | Ikeda et al. | |
| 2013/0206591 A1 | 8/2013 | Takami et al. | |
| 2013/0206592 A1 | 8/2013 | Arakawa et al. | |
| 2013/0206593 A1 | 8/2013 | Arakawa et al. | |
| 2013/0213802 A1 | 8/2013 | Sato et al. | |
| 2013/0213804 A1 | 8/2013 | Arakawa et al. | |
| 2013/0220804 A1 | 8/2013 | Arakawa et al. | |
| 2014/0001038 A1 | 1/2014 | Ogino et al. | |

FOREIGN PATENT DOCUMENTS

JP   2007031808 A  *  2/2007
WO   WO 2011/070850 A1  *  6/2011

OTHER PUBLICATIONS

Translation to Nonaka (JP 2007-031808) published Feb. 2007.*

* cited by examiner

*Primary Examiner* — John Brayton
(74) *Attorney, Agent, or Firm* — Howson & Howson LLP

(57) ABSTRACT

Provided is a ferromagnetic material sputtering target containing a matrix phase made of cobalt, or cobalt and chromium, or cobalt and platinum, or cobalt, chromium and platinum, and an oxide phase including at least chromium oxide, wherein the ferromagnetic material sputtering target contains one or more types among Y, Mg, and Al in a total amount of 10 wtppm or more and 3000 wtppm or less, and has a relative density of 97% or higher. The provided ferromagnetic material sputtering target containing chromium oxide can maintain high density, has uniformly pulverized oxide phase grains therein, and enables low generation of particles.

5 Claims, No Drawings

FERROMAGNETIC MATERIAL SPUTTERING TARGET CONTAINING CHROMIUM OXIDE

BACKGROUND

The present invention relates to a ferromagnetic material sputtering target for use in the deposition of a magnetic thin film for a magnetic recording medium, and particularly a magnetic recording layer of a hard disk adopting the perpendicular magnetic recording system, and refers to a sputtering target capable of inhibiting the generation of particles during sputtering.

In the field of magnetic recording as represented with hard disk drives, a material based on Co, Fe or Ni, which is a ferromagnetic metal, is being used as the material for a magnetic thin film in a magnetic recording medium. Composite materials of Co—Cr-based or Co—Cr—Pt-based ferromagnetic alloys with Co as its main component and nonmagnetic inorganic materials are being used for the recording layer of hard disks adopting the perpendicular magnetic recording system which was recently put into practical application.

A magnetic thin film for a magnetic recording medium such as a hard disk is often produced by sputtering a ferromagnetic material sputtering target having the foregoing materials as its components in light of its high productivity. A hard disk drive which is used as an external recording device is demanded of increased recording density with each passing year, and the reduction of particles that are generated during sputtering is also strongly demanded pursuant to the increase in recording density.

For example, Patent Documents 1, 2, and 3 describe a sputtering target configured from a magnetic phase of cobalt-based metal and a nonmagnetic phase of metal oxide, wherein the generation of particles and arcing during sputtering is reduced by pulverizing oxide phase grains.

Nevertheless, since chromium oxide is not easily sintered, if chromium oxide is subject to sufficient sintering, there are cases where grains of components other than chromium oxide will grow and, when a target with a coarse structure resulting from the foregoing grain growth is used for sputtering, there is a problem in that the generation of particles will increase. Meanwhile, if sintering is restrained in order to suppress the foregoing grain growth, the target density will deteriorate and there is a similar problem in that the generation of particles will increase.
Patent Document 1: JP-A-2009-215617
Patent Document 2: International Publication No. 2007/080781
Patent Document 3: Japanese Patent No. 4837801

SUMMARY OF INVENTION

Generally speaking, if a magnetron sputtering equipment is used to sputter a ferromagnetic material sputtering target, there is a problem in that the generation of particles and arcing will occur during sputtering at the oxide phase as starting point.

In order to resolve the foregoing problem, considered may be pulverizing the oxide phase grains and uniformly dispersing such grains in the sputtering target material. Nevertheless, since chromium oxide is a material that is not easily sintered, it is difficult to uniformly maintain the smaller grains of an oxide phase including a chromium oxide phase, while maintaining high density.

In light of the foregoing problem, an object of this invention is to provide a ferromagnetic material sputtering target containing chromium oxide with low generation of particles wherein oxide phase grains were uniformly pulverized while maintaining high density of the target.

In order to achieve the foregoing object, as a result of intense study, the present inventors discovered that, by containing Y, Mg, and/or Al, these elements inhibit the grain growth of the oxide phase and it is thereby possible to obtain a high-density ferromagnetic material sputtering target with uniformly pulverized oxide phase grains.

Based on the foregoing discovery, the present invention provides:
1) A ferromagnetic material sputtering target containing a matrix phase made of cobalt, or cobalt and chromium, or cobalt and platinum, or cobalt, chromium and platinum, and one or some oxide phases including at least chromium oxide and one or more types of metal oxides of Si and Ti in a total amount of 5 mol % or more and 25 mol % or less, wherein the ferromagnetic material sputtering target contains one or more types among Y, Mg, and Al in a total amount of 10 wtppm or more and 3000 wtppm or less, and has a relative density of 97% or higher;
2) The ferromagnetic material sputtering target according to 1) above, wherein chromium oxide is contained in an amount of 0.5 mol % or more and 10 mol % or less based on $Cr_2O_3$ conversion; and
3) The ferromagnetic material sputtering target according to 1) or 2) above, wherein an average grain size of the oxide phase is 3 $\mu m^2$/grain or less.

Advantageous Effects of Invention

As described above, it is possible to obtain a high-density ferromagnetic material sputtering target by containing a predetermined amount of yttrium (Y), Mg (magnesium), and/or Al (aluminum). Moreover, the sputtering target adjusted as described above yields a superior effect of being able to reduce the generation of arcing and particles during sputtering.

DETAILED DESCRIPTION

The main components configuring the ferromagnetic material sputtering target of the present invention are as follows; namely, a metal of cobalt (Co), metals of cobalt (Co) and chromium (Cr), metals of cobalt (Co) and platinum (Pt), or metals of cobalt (Co), chromium (Cr) and platinum (Pt).

These components are required for a magnetic recording medium, but there is not particular limitation in the mixing ratio thereof so as it is possible to maintain the characteristics as an effective magnetic recording medium. Generally speaking, the following mixing ratios may be used; namely, Co: 50 mol % or more, or Cr: 1 to 50 mol % and the remainder being Co, or Pt: 5 to 30 mol % and the remainder being Co, or Cr: 1 to 50 mol %, Pt: 5 to 30 mol %, and the remainder being Co.

Moreover, other than the foregoing metals, ruthenium (Ru) and boron (B) may also be used as components.

What is important in the present invention is that the target contains chromium oxide as the oxide phase and one or more types of metal oxides of Si and Ti, and further contains one or more types among Y, Mg, and Al in a total amount of 10 wtppm or more and 3000 wtppm or less. When Y, Mg, and/or Al are incorporated in this kind of target containing chromium oxide, and one or more types of metal oxides of Si and Ti; since the elements of Y, Mg, and Al can inhibit the grain growth of the oxide phase and the like, it is possible to suppress the coarsening of the structure while maintaining high density.

Moreover, in the present invention, while the metal oxides of Si and Ti are particularly effective for obtaining superior characteristics as a magnetic recording medium, similar effects can also be obtained by incorporating the metal oxides of Ta and B.

When the total amount of the foregoing metal oxides is less than 5 mol %, it becomes difficult to maintain a granular structure, but when the total amount of the foregoing metal oxides exceeds 25 mol %, the adjustment of the oxide grain size becomes difficult.

More preferably, one or more types among the foregoing Y, Mg, and Al are contained in a total amount of 10 wtppm or more and 3000 wtppm or less. This is because, when the amount of these elements is less than 10 wtppm, the oxide phase grains are subject to grain growth, but when the amount of these elements exceed 3000 wtppm, not only does it become impossible to obtain the intended magnetic properties, the particle characteristics will also deteriorate.

In the present invention, so as long as one or more types among Y, Mg, and Al are contained in a total amount of 10 wtppm or more and 3000 wtppm or less, there is no particular limitation in the method of incorporating these elements.

The ferromagnetic material sputtering target of the present invention desirably has a relative density of 97% or higher. Generally speaking, it is known that, a target having a higher density is able to further reduce the amount of particles that are generated during sputtering. Here, the term "relative density" refers to a value that is obtained by dividing the measured density of the target by the calculated density (also known as the theoretical density) of the target.

In the present invention, it is effective to contain chromium oxide in an amount of 0.5 mol % or more and 10 mol % or less based on $Cr_2O_3$ conversion. When the amount of chromium oxide exceeds 10 mol %, it becomes difficult to adjust the oxide grain size.

In the ferromagnetic material sputtering target of the present invention, the average grain size of the oxide phase is effectively 3 $\mu m^2$/grain or less. The average grain size (diameter) is obtained by calculating the grain area of the respective grains in an image that is magnified to a level which enables the distinction of 100 or more oxide grains, and calculating the (total grain area)/(total number of grains). When the average grain size of the oxide phase exceeds 3 $\mu m^2$/grain, the amount of particles will increase, and this is undesirable.

Moreover, in the present invention, one or more types of Zr and W may also be additionally contained in a total amount of 100 wtppm or more and 15000 wtppm or less. Since the foregoing Zr and W will act as the sintering additive and enable the lowering of the sintering temperature, it becomes possible to inhibit the coarsening of the structure while maintaining high density.

The ferromagnetic material sputtering target of the present invention is manufactured via powder metallurgy.

Foremost, the powders of the respective metal elements and the powders of the respective oxides are prepared. Desirably, the average grain size of these metal powders is 20 $\mu m$ or less. Moreover, the alloy powders of these metals may also be prepared in substitute for the powders of the respective metal elements, and, desirably, the average grain size is also 20 $\mu m$ or less in the foregoing case. Meanwhile, if the grain size is too small, there is a problem in that oxidation is promoted and the component composition will not fall within the intended range. Thus, desirably, the grain size is 0.1 $\mu m$ or more. The oxide powder preferably has an average grain size of 5 $\mu m$ or less, and more preferably 1 $\mu m$ or less.

Subsequently, these metal powders and oxide powders are weighed to the intended composition, mixed and pulverized with well-known methods by using a ball mill or the like.

Subsequently, $Y_2O_3$ powder, MgO powder, and $Al_2O_3$ powder are prepared. These powders desirably have an average grain size of 5 $\mu m$ or less. Meanwhile, since the powders tend to become agglomerated if the grain size is too small, powders having an average grain size of 0.1 $\mu m$ or more are desirably used. These powders are added to the mixed powder of metal powders and oxide powders for further mixing and pulverization. Here, it is also possible to mix the oxide powders as the additive component and the $Cr_2O_3$ powder in advance, perform calcination thereto, and use the pulverized powder as the raw material.

When consideration the problem of oxidation during the mixing process, mixing is preferably performed in an inert gas atmosphere or in a vacuum. Moreover, mixing and pulverization are preferably performed until the average grain size of these powders becomes 1 $\mu m$ or less.

The ferromagnetic material sputtering target of the present invention is prepared by molding and sintering the obtained powder with a vacuum hot pressing furnace, and machining the resulting product into an intended shape. Note that the molding and sintering process is not limited to hot pressing, and plasma discharge sintering or hot isostatic sintering may also be used. The holding temperature during sintering is preferably set to a temperature which is the lowest temperature within the temperature range in which the target can be sufficiently densified. While this will also depend on the target composition, in many cases, the holding temperature is within the temperature range of 800 to 1200° C.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

As metal raw material powders, Co powder having an average grain size of 6 $\mu m$, Cr powder having an average grain size of 5 $\mu m$, and Pt powder having an average grain size of 9 $\mu m$ were prepared, and as oxide raw material powders, $SiO_2$ powder having an average grain size of 0.5 $\mu m$, and $Cr_2O_3$ powder having an average grain size of 3 $\mu m$ were prepared.

Subsequently, in order to attain a target composition of Co-10Cr-20Pt-0.5$Cr_2O_3$-10$SiO_2$, the $Cr_2O_3$ powder and the $SiO_2$ powder as the oxide raw material powders were weighed and mixed to achieve the foregoing composition. $Y_2O_3$ powder was additionally added to the foregoing mixed powder in an amount corresponding to 0.0005 mol % based on the foregoing composition, the resulting mixed powder was subject to calcination in the atmosphere at 1000° C., and thereafter pulverized with a wet ball mill until the average grain size thereof became 1 $\mu m$ or less. Subsequently, the obtained mixed powder and the metal raw material powders were weighed and mixed to achieve the foregoing composition, and pulverized with a dry ball mill in an inert atmosphere until the average grain size thereof became 1 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.5%, and a high-density target was obtained. Moreover, upon observing the structure of the target, the average grain size of the oxide phase was 1.4 μm$^2$/grain, and fine grains were obtained. Moreover, upon performing a compositional analysis of a sample acquired from the target, it was confirmed that the Y content relative to the total component content was 10 wtppm. Moreover, upon conducting a sputtering evaluation of the target, the amount of particles was 5 and a favorable result was obtained.

Example 2

As metal raw material powders, Co powder having an average grain size of 6 μm, Cr powder having an average grain size of 5 μm, and Pt powder having an average grain size of 9 μm were prepared, and as oxide raw material powders, $SiO_2$ powder having an average grain size of 0.5 μm, and $Cr_2O_3$ powder having an average grain size of 3 μm were prepared.

Subsequently, the raw material powders were weighed and mixed to attain a target composition of Co-10Cr-20Pt-0.5$Cr_2O_3$-10$SiO_2$. $Y_2O_3$ powder was additionally added to the obtained mixed powder in an amount of 0.024 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.1%, and a high-density target was obtained. Moreover, upon observing the structure of the target, the average grain size of the oxide phase was 12 μm$^2$/grain, and fine grains were obtained. Moreover, upon performing a compositional analysis of a sample acquired from the target, it was confirmed that the Y content relative to the total component content was 500 wtppm. Moreover, upon conducting a sputtering evaluation of the target, the amount of particles was 2 and a favorable result was obtained.

Example 3

As metal raw material powders, Co powder having an average grain size of 6 μm, Cr powder having an average grain size of 5 μm, and Pt powder having an average grain size of 9 μm were prepared, and as oxide raw material powders, $SiO_2$ powder having an average grain size of 0.5 μm, and $Cr_2O_3$ powder having an average grain size of 3 μm were prepared.

Subsequently, the raw material powders were weighed and mixed to attain a target composition of Co-10Cr-20Pt-5$Cr_2O_3$-10$SiO_2$. $Y_2O_3$ powder was additionally added to the obtained mixed powder in an amount of 0.15 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 97.7%, and a high-density target was obtained. Moreover, upon observing the structure of the target, the average grain size of the oxide phase was 3.0 μm$^2$/grain, and fine grains were obtained. Moreover, upon performing a compositional analysis of a sample acquired from the target, it was confirmed that the Y content relative to the total component content was 3000 wtppm. Moreover, upon conducting a sputtering evaluation of the target, the amount of particles was 12 and a favorable result was obtained.

Example 4

As metal raw material powders, Co powder having an average grain size of 6 μm, and Cr powder having an average grain size of 5 μm were prepared, and as oxide raw material powders, $TiO_2$ powder having an average grain size of 2 μm, and $Cr_2O_3$ powder having an average grain size of 3 μm were prepared.

Subsequently, the raw material powders were weighed and mixed to attain a target composition of Co-10Cr-5$Cr_2O_3$-5$TiO_2$. $Al_2O_3$ powder was additionally added to the obtained mixed powder in an amount of 0.0012 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.9%, and a high-density target was obtained. Moreover, upon observing the structure of the target, the average grain size of the oxide phase was 1.7 μm$^2$/grain, and fine grains were obtained. Moreover, upon performing a compositional analysis of a sample acquired from the target, it was confirmed that the Al content relative to the total component content was 10 wtppm. Moreover, upon conducting a sputtering evaluation of the target, the amount of particles was 7 and a favorable result was obtained.

Example 5

As metal raw material powders, Co powder having an average grain size of 6 μm, and Cr powder having an average grain size of 5 μm were prepared, and as oxide raw material powders, $TiO_2$ powder having an average grain size of 2 μm, and $Cr_2O_3$ powder having an average grain size of 3 μm were prepared.

Subsequently, the raw material powders were weighed and mixed to attain a target composition of Co-10Cr-5Cr$_2$O$_3$-5TiO$_2$. Al$_2$O$_3$ powder was additionally added to the obtained mixed powder in an amount of 0.059 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.1%, and a high-density target was obtained. Moreover, upon observing the structure of the target, the average grain size of the oxide phase was 1.2 μm$^2$/grain, and fine grains were obtained. Moreover, upon performing a compositional analysis of a sample acquired from the target, it was confirmed that the Al content relative to the total component content was 500 wtppm. Moreover, upon conducting a sputtering evaluation of the target, the amount of particles was 3 and a favorable result was obtained.

Example 6

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-5Cr$_2$O$_3$-5TiO$_2$. Al$_2$O$_3$ powder was additionally added to the obtained mixed powder in an amount of 0.36 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 97.9%, and a high-density target was obtained. Moreover, upon observing the structure of the target, the average grain size of the oxide phase was 1.4 μm$^2$/grain, and fine grains were obtained. Moreover, upon performing a compositional analysis of a sample acquired from the target, it was confirmed that the Al content relative to the total component content was 3000 wtppm. Moreover, upon conducting a sputtering evaluation of the target, the amount of particles was 7 and a favorable result was obtained.

Example 7

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-5Cr$_2$O$_3$-5TiO$_2$. MgO powder was additionally added to the obtained mixed powder in an amount of 0.003 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 99.5%, and a high-density target was obtained. Moreover, upon observing the structure of the target, the average grain size of the oxide phase was 2.6 μm$^2$/grain, and fine grains were obtained. Moreover, upon performing a compositional analysis of a sample acquired from the target, it was confirmed that the Mg content relative to the total component content was 10 wtppm. Moreover, upon conducting a sputtering evaluation of the target, the amount of particles was 10 and a favorable result was obtained.

Example 8

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-5Cr$_2$O$_3$-5TiO$_2$. MgO powder was additionally added to the obtained mixed powder in an amount of 0.13 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.9%, and a high-density target was obtained. Moreover, upon observing the structure of the target, the average grain size of the oxide phase was 1.8 μm$^2$/grain, and fine grains were obtained. Moreover, upon performing a compositional analysis of a sample acquired from the target, it was confirmed that the Mg content relative to the total component content was 500 wtppm. Moreover, upon conducting a sputtering evaluation of the target, the amount of particles was 7 and a favorable result was obtained.

Example 9

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-5Cr$_2$O$_3$-5TiO$_2$. MgO powder was additionally added to the obtained mixed powder in an amount of 0.79 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.9%, and a high-density target was obtained. Moreover, upon observing the structure of the target, the average grain size of the oxide phase was 2.1 μm$^2$/grain, and fine grains were obtained. Moreover, upon performing a compositional analysis of a sample acquired from the target, it was confirmed that the Mg content relative to the total component content was 3000 wtppm. Moreover, upon conducting a sputtering evaluation of the target, the amount of particles was 9 and a favorable result was obtained.

Example 10

As metal raw material powders, Co powder having an average grain size of 6 μm, and Cr powder having an average grain size of 5 μm were prepared, and as oxide raw material powders, SiO$_2$ powder having an average grain size of 0.5 μm, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-3SiO$_2$-3Cr$_2$O$_3$-3TiO$_2$. Al$_2$O$_3$ powder and Y$_2$O$_3$ powder were additionally added to the obtained mixed powder in the amounts of 0.011 mol % and 0.003 mol %, respectively, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.5%, and a high-density target was obtained. Moreover, upon observing the structure of the target, the average grain size of the oxide phase was 1.5 μm$^2$/grain, and fine grains were obtained. Moreover, upon performing a compositional analysis of a sample acquired from the target, it was confirmed that the Al content and the Y content relative to the total component content were 100 wtppm and 100 wtppm, respectively. Moreover, upon conducting a sputtering evaluation, the amount of particles was 5 and a favorable result was obtained.

Example 11

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-10Cr$_2$O$_3$-5TiO$_2$. Y$_2$O$_3$ powder was added to the obtained mixed powder in an amount of 0.1 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 97.5% and, upon observing the structure of the target, the average grain size of the oxide phase was 2.4 μm$^2$/grain. Moreover, upon performing a compositional analysis of a sample acquired from the target, it was confirmed that the Y content relative to the total component content was 3000 wtppm. Moreover, upon conducting a sputtering evaluation of the target, the amount of particles was 10 and a favorable result was obtained.

Example 12

As metal raw material powders, Co powder having an average grain size of 6 μm, and Cr powder having an average grain size of 5 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-5Cr$_2$O$_3$-20TiO$_2$. Y$_2$O$_3$ powder was added to the obtained mixed powder in an amount of 0.1 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 99.3% and, upon observing the structure of the target, the average grain size of the oxide phase was 2.8 μm$^2$/grain. Moreover, upon performing a compositional analysis of a sample acquired from the target, it was confirmed that the Y content relative to the total component content was 3000 wtppm. Moreover, upon conducting a sputtering evaluation of the target, the amount of particles was 15 and a favorable result was obtained.

Example 13

As metal raw material powders, Co powder having an average grain size of 6 μm, and Cr powder having an average grain size of 5 μm were prepared, and as oxide raw material powders, TiO$_2$ powder having an average grain size of 2 μm, Cr$_2$O$_3$ powder having an average grain size of 3 μm, and B$_2$O$_3$ powder having an average grain size of 5 μm were prepared.

Subsequently, the raw material powders were weighed and mixed to attain a 1.0 target composition of Co-10Cr-5Cr$_2$O$_3$-5TiO$_2$-2B$_2$O$_3$. Y$_2$O$_3$ powder was added to the obtained mixed powder in an amount of 0.03 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1000° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 97.8% and, upon observing the structure of the target, the average grain size of the oxide phase was 1.5 μm$^2$/grain. Moreover, upon performing a compositional analysis of a sample acquired from the target, it was confirmed that the Y content relative to the total component content was 700 wtppm. Moreover, upon conducting a sputtering evaluation of the target, the amount of particles was 8 and a favorable result was obtained.

Example 14

As metal raw material powders, Co powder having an average grain size of 6 μm, and Cr powder having an average grain size of 5 μm were prepared, and as oxide raw material powders, TiO$_2$ powder having an average grain size of 2 μm, Cr$_2$O$_3$ powder having an average grain size of 3 μm, and CoO powder having an average grain size of 5 μm were prepared.

Subsequently, the raw material powders were weighed and mixed to attain a target composition of Co-10Cr-5Cr$_2$O$_3$-5TiO$_2$-2CoO. Y$_2$O$_3$ powder was added to the obtained mixed powder in an amount of 0.03 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98% and, upon observing the structure of the target, the average grain size of the oxide phase was 1.6 μm$^2$/grain. Moreover, upon performing a compositional analysis of a sample acquired from the target, it was confirmed that the Y content relative to the total component content was 800 wtppm. Moreover, upon conducting a sputtering evaluation of the target, the amount of particles was 8 and a favorable result was obtained.

Example 15

As metal raw material powders, Co powder having an average grain size of 6 μm, and Pt powder having an average grain size of 9 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-15Pt-5Cr$_2$O$_3$-5TiO$_2$. Y$_2$O$_3$ powder was added to the obtained mixed powder in an amount of 0.02 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98.2% and, upon observing the structure of the target, the average grain size of the oxide phase was 1.3 μm$^2$/grain. Moreover, upon performing a compositional analysis of a sample acquired from the target, it was confirmed that the Y content relative to the total component content was 500 wtppm. Moreover, upon conducting a sputtering evaluation of the target, the amount of particles was 5 and a favorable result was obtained.

Example 16

As metal raw material powders, Co powder having an average grain size of 6 μm, Cr powder having an average grain size of 5 μm, Pt powder having an average grain size of 9 μm, and Ru powder having an average grain size of 15 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-15Pt-5Ru-5Cr$_2$O$_3$-5TiO$_2$. Y$_2$O$_3$ powder was added to the obtained mixed powder in an amount of 0.05 mol %, and the resulting mixed powder was pulverized in an inert atmosphere until the average grain size thereof became 2 μm or less.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 97.5% and, upon observing the structure of the target, the average grain size of the oxide phase was 2.0 μm$^2$/grain. Moreover, upon performing a compositional analysis of a sample acquired from the target, it was confirmed that the Y content relative to the total component content was 1000 wtppm. Moreover, upon conducting a sputtering evaluation of the target, the amount of particles was 10 and a favorable result was obtained.

Comparative Example 1

As metal raw material powders, Co powder having an average grain size of 6 μm, Cr powder having an average grain size of 5 μm, and Pt powder having an average grain size of 9 μm were prepared, and as oxide raw material powders, TiO$_2$ powder having an average grain size of 2 μm, and Cr$_2$O$_3$ powder having an average grain size of 3 μm were prepared.

Subsequently, the raw material powders were weighed and mixed to attain a target composition of Co-10Cr-20Pt-5Cr$_2$O$_3$-5TiO$_2$. In Comparative Example 1, Y$_2$O$_3$ powder, MgO powder, and/or Al$_2$O$_3$ powder were not added.

Thereafter, the pulverized mixed powder was filled in a carbon mold, and hot pressed in a vacuum atmosphere under the following conditions; namely, temperature of 1050° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 99%. However, upon observing the structure of the target, the average grain size of the oxide phase was 3.6 $\mu m^2$/grain. Moreover, upon performing a compositional analysis of a sample acquired from the target, it was confirmed that the contents of Y, Mg, and Al relative to the total component content were respectively less than 10 ppm (less than detection limit).

Accordingly, with Comparative Example 1, since the amounts of Y, Mg, and Al are too small, the oxide phase grains were subject to grain growth, and the intended particle characteristics could not be obtained.

Comparative Example 2

As metal raw material powders, Co powder having an average grain size of 6 μm, and Cr powder having an average grain size of 5 μm were prepared, and as oxide raw material powders, $SiO_2$ powder having an average grain size of 0.5 μm, and $Cr_2O_3$ powder having an average grain size of 3 μm were prepared.

Subsequently, the raw material powders were weighed and mixed to attain a target composition of Co-10Cr-15$Cr_2O_3$-5$SiO_2$. In Comparative Example 2, chromium oxide was added excessively. $Al_2O_3$ powder was added to the obtained mixed powder in an amount of 0.4 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1150° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 95%, and deterioration in the density was observed. Moreover, upon observing the structure of the target, the average grain size of the oxide phase was 4.1 $\mu m^2$/grain and, upon conducting a sputtering evaluation of the target, the amount of particles increased to 32. Note that, upon performing a compositional analysis of a sample acquired from the target, it was confirmed that the Al content relative to the total component content was 3000 wtppm.

Accordingly, with Comparative Example 2, since the amount of $Cr_2O_3$ is excessive, it was not possible to increase the density while inhibiting the grain growth of the oxide phase grains, and the intended particle characteristics could not be obtained.

Comparative Example 3

As metal raw material powders, Co powder having an average grain size of 6 μm, and Cr powder having an average grain size of 5 μm were prepared, and as oxide raw material powders, $SiO_2$ powder having an average grain size of 0.5 μm, $Cr_2O_3$ powder having an average grain size of 3 μm, and $TiO_2$ powder having an average grain size of 2 μm were prepared.

Subsequently, the raw material powders were weighed and mixed to attain a target composition of Co-10Cr-5$Cr_2O_3$-5$SiO_2$-20$TiO_2$. In Comparative Example 3, $Y_2O_3$ powder was added to the obtained mixed powder in an amount of 0.11 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1150° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 99%, and deterioration in the density was observed. Moreover, upon observing the structure of the target, the average grain size of the oxide phase was large at 6.2 $\mu m^2$/grain and, upon conducting a sputtering evaluation of the target, the amount of particles increased to 45. Note that, upon performing a compositional analysis of a sample acquired from the target, it was confirmed that the Y content relative to the total component content was 3000 wtppm.

Accordingly, when the amount of oxide is excessive, it was not possible to increase the density while inhibiting the grain growth of the oxide phase grains, and the intended particle characteristics could not be obtained.

Comparative Example 4

As metal raw material powders, Co powder having an average grain size of 6 μm, and Cr powder having an average grain size of 5 μm were prepared, and as oxide raw material powders, $TiO_2$ powder having an average grain size of 2 μm, and $Cr_2O_3$ powder having an average grain size of 3 μm were prepared.

Subsequently, the raw material powders were weighed and mixed to attain a target composition of Co-10Cr-5$Cr_2O_3$-5$TiO_2$. In Comparative Example 4, MgO powder was added to the obtained mixed powder in an amount of 1.05 mol %, and the resulting mixed powder was pulverized in an inert atmosphere until the average grain size thereof became 1 μm or less.

Thereafter, the pulverized mixed powder was filled in a carbon mold, and hot pressed in a vacuum atmosphere under the following conditions; namely, temperature of 1100° C., holding time of 2 hours, and applied pressure of 30 MPa, to obtain a sintered compact. The obtained sintered compact was cut with a lathe to obtain a disk-shaped target having a diameter of 180 mm and thickness of 7 mm.

As shown in Table 1, the relative density of the target was 98%. However, upon observing the structure of the target, the average grain size of the oxide phase was large at 3.8 $\mu m^2$/grain and, upon conducting a sputtering evaluation of the target, the amount of particles increased to 28. Note that, upon performing a compositional analysis of a sample acquired from the target, it was confirmed that the Mg content relative to the total component content was 4000 wtppm.

Accordingly, when the Mg content is excessive, not only was it impossible to obtain the intended magnetic properties, it was also impossible to obtain the intended particle characteristics.

TABLE 1

|  | Target Composition (mol %) | Additive Form | Y, Mg, Al Content (metal conversion) (wtppm) | Relative Density (%) | Oxide Grain Size ($\mu m^2$/grain) | Amount of Particles (particles) |
|---|---|---|---|---|---|---|
| Example 1 | Co—10Cr—20Pt—0.5$Cr_2O_3$—10$SiO_2$ | $Y_2O_3$ | 10 | 98.5 | 1.4 | 5 |
| Example 2 | Co—10Cr—20Pt—0.5$Cr_2O_3$—10$SiO_2$ | $Y_2O_3$ | 500 | 98.1 | 1.2 | 2 |
| Example 3 | Co—10Cr—20Pt—5$Cr_2O_3$—10$SiO_2$ | $Y_2O_3$ | 3000 | 97.7 | 3 | 12 |
| Example 4 | Co—10Cr—5$Cr_2O_3$—5$TiO_2$ | $Al_2O_3$ | 10 | 98.9 | 1.7 | 7 |
| Example 5 | Co—10Cr—5$Cr_2O_3$—5$TiO_2$ | $Al_2O_3$ | 500 | 98.1 | 1.2 | 3 |
| Example 6 | Co—10Cr—5$Cr_2O_3$—5$TiO_2$ | $Al_2O_3$ | 3000 | 97.9 | 1.4 | 7 |
| Example 7 | Co—10Cr—5$Cr_2O_3$—5$TiO_2$ | MgO | 10 | 99.5 | 2.6 | 10 |
| Example 8 | Co—10Cr—5$Cr_2O_3$—5$TiO_2$ | MgO | 500 | 98.9 | 1.8 | 7 |
| Example 9 | Co—10Cr—5$Cr_2O_3$—5$TiO_2$ | MgO | 3000 | 98.9 | 2.1 | 9 |
| Example 10 | Co—10Cr—3$SiO_2$—3$Cr_2O_3$—3$TiO_2$ | $Al_2O_3$ $Y_2O_3$ | 100 100 | 98.5 | 1.5 | 5 |
| Example 11 | Co—10Cr—10$Cr_2O_3$—5$TiO_2$ | $Y_2O_3$ | 3000 | 97.5 | 2.4 | 10 |
| Example 12 | Co—10Cr—5$Cr_2O_3$—20$TiO_2$ | $Y_2O_3$ | 3000 | 99.3 | 2.8 | 15 |
| Example 13 | Co—10Cr—5$Cr_2O_3$—5$TiO_2$—2$B_2O_3$ | $Y_2O_3$ | 700 | 97.8 | 1.5 | 8 |
| Example 14 | Co—10Cr—5$Cr_2O_3$—5$TiO_2$—2CoO | $Y_2O_3$ | 800 | 98 | 1.6 | 8 |
| Example 15 | Co—15Pt—5$Cr_2O_3$—5$TiO_2$ | $Y_2O_3$ | 500 | 98.2 | 1.3 | 5 |
| Example 16 | Co—10Cr—15Pt—5Ru—5$Cr_2O_3$—5$TiO_2$ | $Y_2O_3$ | 1000 | 97.5 | 2 | 10 |
| Comparative Example 1 | Co—10Cr—20Pt—5$Cr_2O_3$—5$TiO_2$ | — | <10 | 99 | 3.6 | 20 |
| Comparative Example 2 | Co—10Cr—15$Cr_2O_3$—5$SiO_2$ | $Al_2O_3$ | 3000 | 95 | 4.1 | 32 |
| Comparative Example 3 | Co—10Cr—5$SiO_2$—5$Cr_2O_3$—20$TiO_2$ | $Y_2O_3$ | 3000 | 99 | 6.2 | 45 |
| Comparative Example 4 | Co—10Cr—5$Cr_2O_3$—5$TiO_2$ | MgO | 4000 | 98 | 3.8 | 28 |

In all cases from Examples 1 to 16, it was confirmed that the obtained target has a high density with oxides finely dispersed therein. It can be understood that this kind of structure plays an extremely important role in reducing the amount of particles that are generated during sputtering and improving the yield during deposition.

The present invention can maintain a high target density and inhibit grain growth by containing Y, Mg, and/or Al in the ferromagnetic material sputtering target, which contains chromium oxide. Accordingly, by using the target of the present invention, it is possible to considerably reduce the generation of particles during sputtering with a magnetron sputtering equipment. The present invention is useful as a ferromagnetic material sputtering target for use in the deposition of a magnetic thin film for a magnetic recording medium, and particularly of a recording layer of a hard disk drive.

The invention claimed is:

1. A ferromagnetic material sputtering target containing a matrix phase made of cobalt, or cobalt and chromium, or cobalt and platinum, or cobalt, chromium and platinum, and two or more oxide phases including a chromium oxide and at least an oxide of a metal selected from the group consisting of Si and Ti in a total amount of 5 mol % or more and 25 mol % or less, wherein the ferromagnetic material sputtering target contains one or more oxides of a metal element selected from the group consisting of Y, Mg, and Al in which a total amount of the metal elements Y, Mg, and Al is 10 wtppm or more and 3000 wtppm or less, and has a relative density of 97% or higher.

2. The ferromagnetic material sputtering target according to claim 1, wherein the sputtering target contains 0.5 mol % or more and 10 mol % or less of the chromium oxide.

3. The ferromagnetic material sputtering target according to claim 2, wherein an average grain size of the oxide phases is 3 $\mu m^2$/grain or less.

4. The ferromagnetic material sputtering target according to claim 1, wherein an average grain size of the oxide phases is 3 $\mu m^2$/grain or less.

5. The ferromagnetic material sputtering target according to claim 2, wherein the chromium oxide is $Cr_2O_3$.

* * * * *